United States Patent [19]

Taylor

[11] 4,006,369
[45] Feb. 1, 1977

[54] CURRENT GENERATOR INCLUDING A RATE DISCRIMINATOR

[75] Inventor: Keith Alan Taylor, Portland, Oreg.

[73] Assignee: Tektronix, Inc., Beaverton, Oreg.

[22] Filed: June 9, 1975

[21] Appl. No.: 585,013

[52] U.S. Cl. .............................. 307/261; 307/231; 328/114; 328/132; 330/15

[51] Int. Cl.² ...................... H03K 5/00; H03F 3/26

[58] Field of Search ........................ 307/231–233, 307/261, 296; 328/114, 132, 184–185; 330/15, 119, 123; 315/370, 371

[56] References Cited

UNITED STATES PATENTS

| | | | |
|---|---|---|---|
| 3,048,717 | 8/1962 | Jenkins | 328/132 X |
| 3,408,533 | 10/1968 | Gates | 330/15 |
| 3,559,085 | 1/1971 | Ishijima | 330/15 X |
| 3,715,738 | 2/1973 | Kleist et al. | 328/114 X |

Primary Examiner—John Zazworsky
Attorney, Agent, or Firm—George T. Noe

[57] ABSTRACT

An electronic circuit is disclosed which passes current to an output node when the rate of change of voltage on an input node exceeds a predetermined value. A differentiating network is serially disposed between a voltage-driven source and a normally cut off common base amplifier to monitor the rate of change of the voltage signal. The common base amplifier is prebiased to conduct when the output of the differentiator exceeds the threshold value. The circuit may include temperature compensation means and adjustable prebiasing means. When a pair of such circuits are utilized in a differential or push-pull mode, the displacement current in the pair of capacitors has a serial conduction path for rates of change of input voltage below the threshold value, and a parallel conduction path above the threshold value.

4 Claims, 3 Drawing Figures

CURRENT GENERATOR INCLUDING A RATE DISCRIMINATOR

BACKGROUND OF THE INVENTION

The present invention relates generally to electronic amplifying circuits and more particularly to an amplifier responsive to the output of a rate discriminator to provide additional current to an output circuit.

Semiconductor devices operated well within design specifications perform reasonably well for their intended applications, such design specifications being an attempt to optimize certain characteristics of the intrinsic semiconductor material. Some of the more important of these characteristics are current amplification factor alpha ($\alpha$), current gain factor beta ($\beta$), and the maximum frequency ($f_T$) at which the device can be operated. In many integrated circuits, the $f_T$ characteristic is replaced by a characteristic called slew rate, which is the maximum rate at which an output terminal can slew form one level to another and is thus related to frequency response. Optimizing one characteristic in the design of a semiconductor device is usually at the expense of degrading the other characteristics. For this reason, many different transistors and integrated circuits are available for different specific applications.

It is sometimes necessary to operate these designs in regions approaching limitations imposed by the inherent characteristics. One such application is the output amplifier sections of an oscilloscope, where high current levels through the output transistors to drive the capacitive deflection plates results in a non-uniform alpha characteristic. This is particularly noticeable in the horizontal amplifier, which amplifies a linear sawtooth voltage to suitably drive the deflection plates at a linear rate to produce a linear time-base sweeping of the cathode-ray tube electron beam. Any current starvation due to changes in alpha at the higher sweep rates, or distortions resulting from $f_T$ or slew-rate limiting results in a non-linear, and therefore unreliable, sweep rate.

SUMMARY OF THE INVENTION

The present invention overcomes the aforementioned difficulties by providing a means to sense the rate of change of the input signal and to inject additional current into the output load when the rate of change exceeds a predetermined value. Further, the quantity of additional current supplied is proportional to the amount of excess of the predetermined rate of change of the input signal.

The input signal voltage is applied to an RC differentiating network. A common-base transistor amplifier is serially connected between the differentiating network and the load to provide a high-impedance current source therefor, and is biased to a normally-off condition. When the predetermined rate threshold is reached, the transistor turns on and conducts current to the load. The common-base amplifier may include a temperature-compensation diode in series with the base-emitter junction thereof, and a bias-voltage control means to permit precise adjustment of the amplifier turn-on.

In the commercial embodiment of the present invention, a pair of oppositely-poled current generators of the type described hereinabove are connected across a push-pull output stage of an oscilloscope horizontal amplifier to provide additional current to the capacitive deflection plates at high sweep rates to maintain linear sweep voltage thereacross.

It is therefore one object of the present invention to supply current to an output node when a predetermined rate of change of voltage on an input node is exceeded.

It is another object to compensate for current starvation tendencies of semiconductor amplifiers as operating limits are approached.

It is a further object to provide a current generator responsive to the output of a differentiating network.

It is yet another object to provide a temperature-compensated current generator. It is yet a further object to provide a current generator which may be adjustably prebiased to conduct when an input voltage exceeds a predetermined threshold.

It is still another object to provide a pair of oppositely-poled current generators to augment output current in a push-pull amplifier.

It is still a further object to provide a pair of oppositely-poled current generators having serially-connected capacitors below a predetermined rate of change of input voltage and parallel-connected capacitors above the predetermined rate of change.

DRAWINGS

DETAILED DESCRIPTION

Figure 1:
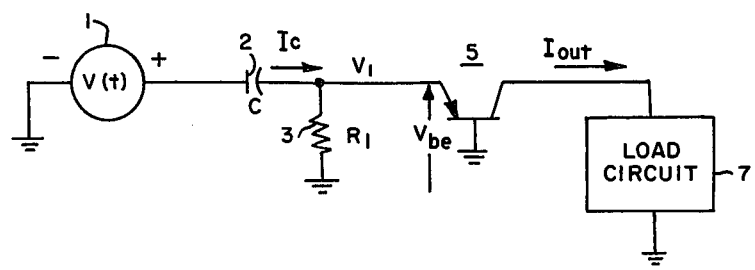
FIG. 1 shows a basic current generator according to the present invention.

Turning now to the drawings, a basic current generator according to the present invention is shown in FIG. 1. A source of input voltage $v(t)$ represented by voltage generator 1 is connected to the input of an RC differentiating network comprising a capacitor 2 and a resistor 3. A transistor 5, shown as a common-base amplifier, is connected by the emitter thereof to the output of the differentiating network. A load circuit 7 is connected to the collector of transistor 5, and sees the high impedance of the transistor collector as its driving source.

The circuit as shown will respond to the rate of change of a positive-going voltage signal in the following manner: Assuming that the voltage $V_1$ across resistor 3 is small, the current through capacitor 2 may be described by the equation $$I_c = C \frac{dv(t)}{dt},$$

where $c$ is the value of the capacitance. From the laws of differential calculus, it can readily be discerned that the current $I_c$ is proportional to the derivative, or rate of change, of the input voltage signal $v(t)$. With transistor 5 initially off, the current $I_c$ flows to ground through resistor 3, developing a voltage $V_1$ thereacross. Therefore, $$V_1 = I_c R_1 = CR_1 \frac{dv(t)}{dt},$$

where $R_1$ is the value of resistance of resistor 3. As the rate of change of $v(t)$ increases, $V_1$ increases to the point at which transistor 5 is biased into conduction, at which point $V_1 = V_{be}$, the base-emitter voltage drop of the transistor. Any further increases in $I_c$ due to increased rate-of-change of $v(t)$ will flow through transistor 5 to the load because the voltage $V_1$ cannot rise above $V_{be}$, holding the fraction of $I_c$ flowing through resistor 3 constant. The load impedance has no effect on the differentiating network because of the high impedance provided by the collector of transistor 5.

Therefore, the current to the load may be described as $$I_{out} \cong C \frac{dv(t)}{dt} - \frac{V_{be}}{R_1}.$$

The voltage $V_{be}$ will vary slightly as a function of current from the turn-on point to the active operating region of the transistor, typically on the order of 100–200 millivolts, but may be more or less depending on the transistor used.

The component values of $C$ and $R_1$ may be selected so that $V_1 = V_{be}$ at a particular rate of change of the input voltage, thus when the rate of change is exceeded, $I_{out}$ is directly proportional to the rate of change. With the PNP-type transistor shown in FIG. 1, a negative-going rate of change of input signal will drive $V_1$ negative, cutting the transistor off. Therefore, as mentioned earlier, this circuit configuration is responsive only to a positive-going rate of change of input signal. It can be appreciated, however, that the use of an NPN transistor would effect a current generator responsive to negative-going signals.

Figure 2:
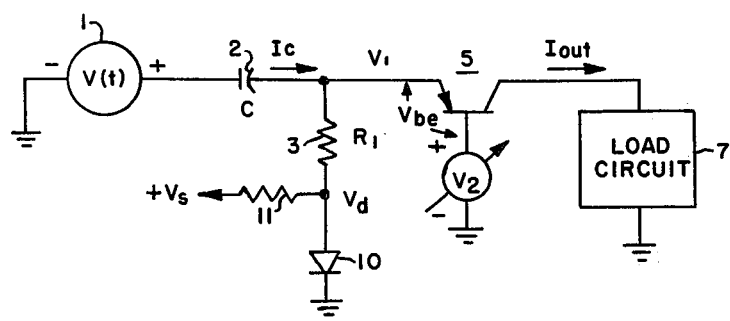
FIG. 2 shows the basic current generator with temperature-compensation means and adjustable prebiasing means.

The circuit of FIG. 2 is similar to that of FIG. 1, using similar reference numerals, and showing the addition of temperature-compensation circuitry and prebiasing means to precisely establish the transistor turn-on point. A diode 10 is serially connected between resistor 3 and ground, and consequently is in series with the emitter of transistor 5. A resistor is connected between the anode of diode 10 and a source of positive voltage to hold the diode in a conducting mode and thereby develop a voltage $V_d$ thereacross. The diode 10 should be chosen to be of the same material or thermal properties as those of transistor 5, so that $V_d \cong V_{be}$ over a wide temperature range. The effect is to maintain the voltage across resistor 3 constant while the transistor is conducting, thereby nullifying a change in current through the transistor because of a change in temperature. Similar temperature-compensation schemes are well known in the art.

A source of variable voltage $V_2$ is connected between the base of transistor 5 and ground to facilitate the precise adjustment of the prebiasing level of the transistor. It can be seen by summing up the voltage drops in the base-emitter loop that $V_1 - V_d = V_2$ provided $V_d = V_{be}$. Consequently the current through resistor 3 is equal to $$\frac{V_2}{R_1},$$

and $$I_{out} \cong C \frac{dv(t)}{dt} - \frac{V_2}{R_1}.$$

It can readily be appreciated, then, that if $V_2 = 0$ volts, $$\frac{V_2}{R_1} = 0,$$

and $I_{out} = I_c$. In actual practice, the value of $V_2$ may be adjusted to any value which will set the turn-on point of the transistor in accordance with a corresponding rate of change of input voltage to compensate for component value tolerances and differences in $V_{be}$ from one replaceable transistor to another.

Figure 3:
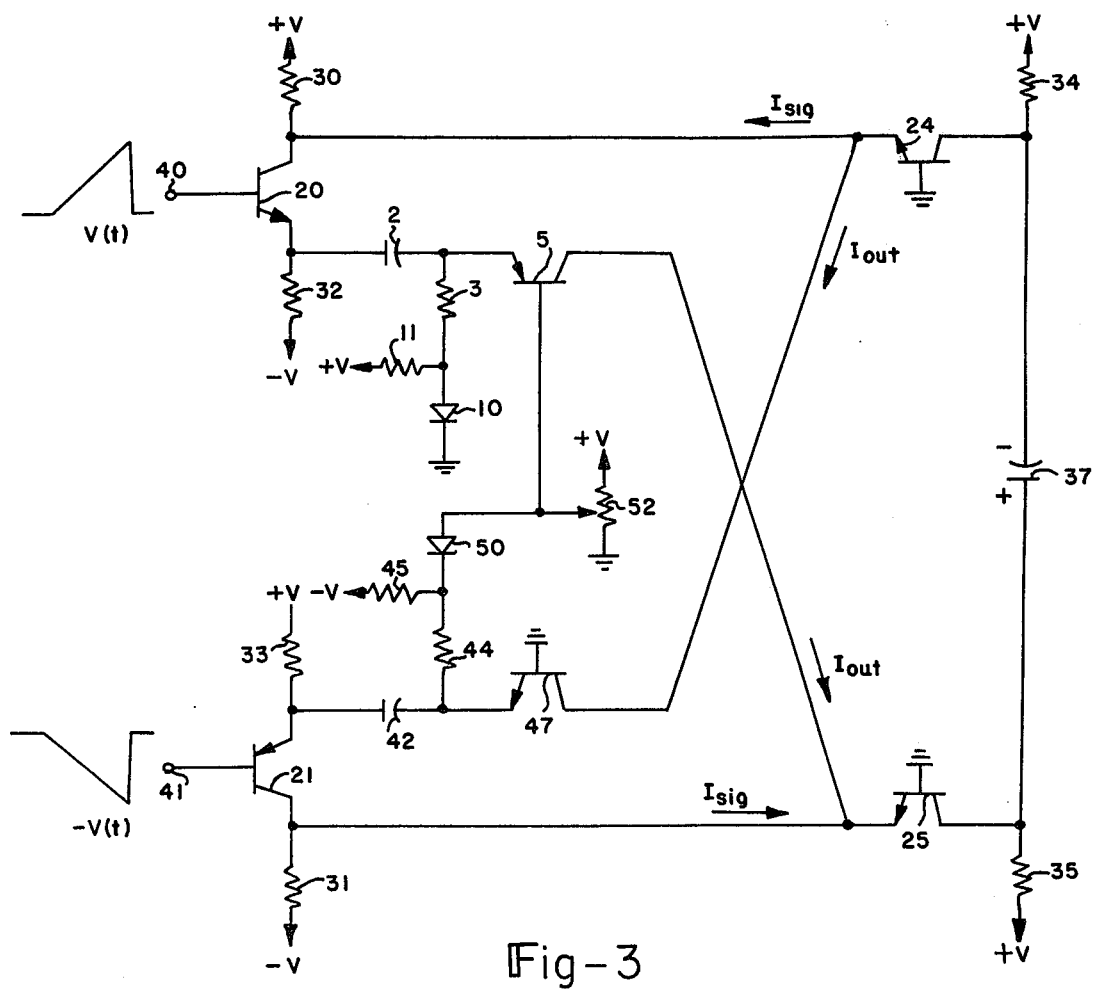
FIG. 3 illustrates oppositely-poled current generators according to the present invention connected into the horizontal amplifier stage of an oscilloscope.

FIG. 3 illustrates the implementation of the present invention into a push-pull horizontal amplifier stage, utilizing oppositely-poled current generators to augment the output current to the deflection plates at the higher sweep rates. The horizontal amplifier includes a common-emitter amplifier input stage comprising transistors 20 and 21, and a common-base amplifier output stage comprising transistors 24 and 25. Transistors 20 and 21, shown to be NPN and PNP conductivity types respectively, are connected between positive and negative sources of supply voltages through collector load resistors 30 and 31 and emitter resistors 32 and 33 respectively. The bases of transistors 24 and 25, shown to be NPN conductivity types, are grounded, and the collectors of these transistors are returned to a source of positive voltage through resistors 34 and 35 respectively, such resistors forming part of the collector load. A capacitor 37 is shown connected between the collectors of transistors 24 and 25 to represent the capacitive load of the horizontal deflection plates. In actuality, the left deflection plate is connected to the collector of transistor 24 to receive the negative-going sawtooth voltage, and the right deflection plate is connected to the collector of transistor 25 to receive the positive-going sawtooth voltage.

The push-pull sawtooth signals are applied via terminals 40 and 41 to the bases of transistors 20 and 21 respectively. The positive-going input signal is designated $v(t)$ and the negative-going input signal is designated $-v(t)$. Through emitter follower action of transistors 20 and 21, these signals are present at the emitters thereof while the amplified and inverted signals are developed at the collectors thereof.

Connected to the emitter of transistor 20 is a rate discriminator and current generator essentially as shown in FIG. 2, and for simplicity the same reference numerals are used in FIG. 3 to show the implementation of the previously discussed circuit. Connected to the emitter of transistor 21 is the oppositely-poled alternative, comprising capacitor 42, resistors 44 and 45, transistor 47, and diode 50.

Prebiasing for transistors 5 and 47 is achieved by adjustment of potentiometer 52, which is connected to the base of transistor 5. The anode of diode 50 is connected to the base of transistor 5, and because the base of transistor 47 is grounded, prebiasing of transistor 47 is effected by adjusting the emitter reference voltage.

When the rate of change of sawtooth signals $v(t)$ and $-v(t)$ exceeds the rate determined by capacitors 2 and 42 and resistors 3 and 44, transistors 5 and 47 turn on in the manner described previously to inject additional current into the emitters of transistors 24 and 25, and hence, to the capacitive load, to maintain the linearity of the output signal. Using mathematical terms, transistors 5 and 47 are turned on when the derivatives of $v(t)$ and $-v(t)$ are greater than zero, and the amount of output current increases linearly thereafter with linear increases in $d|v(t)|/dt$.

It can be discerned from a perusal of FIG. 3 that when the rate of change of the input voltage is less than a predetermined value and transistors 5 and 47 are turned off, the changing load current flows at least in part through the serial connection of capacitors 2 and 42, with the actual current path from capacitor 37, through transistors 24 and 20, capacitor 2, resistor 3, diode 10, from ground through the source of $+V$, a portion of resistor 52, diode 50, resistor 44, capacitor 42, transistors 21 and 25, back to capacitor 37. When the predetermined rate-of-change value is exceeded, a parallel path of capacitors 2 and 42 is effected, with the current splitting at the emitter of transistor 24 and one portion thereof flowing through transistor 20, capacitor 2, and transistor 5 while a second portion thereof is flowing through transistor 47, capacitor 42, and transistor 21. The two separate current paths then meet at the emitter of transistor 25. Thus an apparent "re-wiring" of the circuit is effected on the high-speed signals to provide the current boost demanded by the load to maintain signal integrity.

While there have been shown and described the preferred embodiments of the present invention, it will be apparent to those skilled in the art that many changes and modifications may be made without departing therefrom in its broader aspects; therefore, the appended claims are intended to cover all such changes and modifications as fall within the true spirit and scope of this invention.

What I claim as being novel is:

1. An electronic circuit for providing additional current to the load of a push-pull amplifier during high-frequency operation of push-pull signals to compensate for limiting characteristics of the semiconductor devices of said amplifier, comprising:
   input circuit means adapted for receiving said push-pull signals and producing an output current proportional to the rate of change thereof; and
   amplifier means including bias network means for passing said output current to said load, said bias network means holding said amplifier means off when said output current is less than a predetermined value and turning said amplifier means on when said output current exceeds a predetermined value.

2. An electronic circuit in accordance with claim 1 wherein said input circuit means includes a first capacitor coupled between one input of said push-pull amplifier and ground, and a second capacitor coupled between the opposite-polarity input of said push-pull amplifier and ground, said first and second capacitors providing a serial siganl current conduction path when said amplifier means is turned off and a pair of parallel signal current conduction paths when said amplifier means is turned on.

3. An electronic circuit in accordance with claim 1 wherein said amplifier means includes a pair of oppositely-poled transistor means each having collector means thereof coupled to said load to provide current thereto in phase with current from said push-pull amplifier.

4. An electronic circuit in accordance with claim 1 wherein said bias network means includes impedance means and adjustable voltage source means.

* * * * *

UNITED STATES PATENT AND TRADEMARK OFFICE
CERTIFICATE OF CORRECTION

PATENT NO. : 4,006,369
DATED : February 1, 1977
INVENTOR(S) : KEITH ALAN TAYLOR

It is certified that error appears in the above-identified patent and that said Letters Patent are hereby corrected as shown below:

Column 1, Line 21, "form" should be --from--.
Column 1, line 28, "designs" should be --devices--.
Column 6, line 23, "siganl" should be --signal--.

Signed and Sealed this

Twenty-eighth Day of February 1978

[SEAL]

Attest:

RUTH C. MASON
Attesting Officer

LUTRELLE F. PARKER
Acting Commissioner of Patents and Trademarks